(12) United States Patent
Lai et al.

(10) Patent No.: US 8,982,575 B2
(45) Date of Patent: Mar. 17, 2015

(54) DISPLAY DEVICE WITH FLEXIBLE SUBSTRATE AND MANUFACTURING METHOD THEREOF

(71) Applicant: AU Optronics Corporation, Hsin-Chu (TW)

(72) Inventors: Yen-Huei Lai, Taichung (TW);
Chun-Chung Wu, Taichung (TW);
Chih-Cheng Chan, Taichung (TW);
Wei-Chia Fang, Taichung (TW);
Keh-Long Hwu, Taichung (TW);
Chih-Jen Hu, Taichung (TW)

(73) Assignee: Au Optronics Corporation, Hsin-Chu (TW)

( * ) Notice: Subject to any disclaimer, the term of this patent is extended or adjusted under 35 U.S.C. 154(b) by 263 days.

(21) Appl. No.: 13/678,596

(22) Filed: Nov. 16, 2012

(65) Prior Publication Data

US 2013/0135830 A1 May 30, 2013

(30) Foreign Application Priority Data

Nov. 16, 2011 (TW) ............................. 100141870 A
Jul. 18, 2012 (TW) ............................. 101125785 A

(51) Int. Cl.
| H05K 1/00 | (2006.01) |
| H05K 7/00 | (2006.01) |
| H05K 7/06 | (2006.01) |

(Continued)

(52) U.S. Cl.
CPC .............. *H05K 7/06* (2013.01); *H05K 13/0469* (2013.01); *Y10T 29/4913* (2015.01); *G02F 1/133305* (2013.01); *G09F 9/301* (2013.01); *G09F 9/33* (2013.01); *G02F 1/13452* (2013.01)

USPC .............................. 361/771; 361/749; 445/25

(58) Field of Classification Search
USPC ..................................... 361/771, 749; 445/25
See application file for complete search history.

(56) References Cited

U.S. PATENT DOCUMENTS 5,193,022 A * 3/1993 Hirai .............................. 349/150
6,831,727 B2 * 12/2004 Akiyama et al. .............. 349/158

(Continued)

FOREIGN PATENT DOCUMENTS

| CN | 102157110 A | * | 8/2011 |
| JP | 8-316590 | | 11/1996 |

(Continued)

OTHER PUBLICATIONS

English translation of abstract of TW M368138 (Nov. 1, 2009).

(Continued)

*Primary Examiner* — Jeremy C Norris
*Assistant Examiner* — Nathan Milakovich
(74) *Attorney, Agent, or Firm* — McClure, Qualey & Rodack, LLP

(57) ABSTRACT

A display device and a manufacturing method thereof are provided. The display of the present invention includes a flexible substrate, a display layer, a protecting layer, an electronic unit, and a filling glue. The flexible substrate has a carrying surface. The display layer is disposed on the carrying surface and has a side edge. The protecting layer is disposed on the opposite side of the display layer corresponding to the carrying surface. The electronic unit is disposed on the carrying surface with a space formed between the electronic unit and the side edge of the display layer. The filling glue is filled in the space and connected with the side edge of the display layer, the electronic unit, and the carrying surface.

24 Claims, 15 Drawing Sheets

(51) Int. Cl.
*H05K 13/04* (2006.01)
*G02F 1/1333* (2006.01)
*G09F 9/30* (2006.01)
*G09F 9/33* (2006.01)
*G02F 1/1345* (2006.01)

(56) References Cited

U.S. PATENT DOCUMENTS

| | | | |
|---|---|---|---|
| 7,023,518 B1* | 4/2006 | Koyama et al. | 349/151 |
| 7,659,663 B2* | 2/2010 | Kwak | 313/506 |
| 7,692,847 B2* | 4/2010 | Kurosawa | 359/296 |
| 7,791,704 B2* | 9/2010 | Abe | 349/153 |
| 8,000,091 B2* | 8/2011 | Shinn et al. | 361/679.1 |
| 8,004,620 B2* | 8/2011 | Ishii et al. | 349/12 |
| 8,063,562 B2* | 11/2011 | Gomi | 313/512 |
| 8,198,630 B2* | 6/2012 | Yamazaki et al. | 257/59 |
| 8,274,633 B2* | 9/2012 | Ino | 349/150 |
| 8,633,489 B2* | 1/2014 | Jung et al. | 257/59 |
| 8,786,820 B2* | 7/2014 | Wu et al. | 349/158 |
| 8,816,212 B2* | 8/2014 | Hu | 174/254 |
| 2006/0197902 A1* | 9/2006 | Cho et al. | 349/153 |
| 2007/0013822 A1* | 1/2007 | Kawata et al. | 349/41 |
| 2009/0184919 A1* | 7/2009 | Shinn et al. | 345/107 |
| 2010/0033451 A1 | 2/2010 | Shinn et al. | |
| 2010/0117531 A1* | 5/2010 | Park et al. | 313/512 |
| 2010/0163284 A1* | 7/2010 | Tanahara | 174/255 |
| 2010/0208188 A1* | 8/2010 | Tsai et al. | 349/153 |
| 2010/0261012 A1 | 10/2010 | Huang et al. | |
| 2011/0235160 A1* | 9/2011 | Hsieh et al. | 359/296 |
| 2011/0286077 A1* | 11/2011 | Chan et al. | 359/296 |
| 2012/0069509 A1* | 3/2012 | Ikeguchi | 361/679.01 |
| 2012/0099056 A1* | 4/2012 | Lee et al. | 349/106 |
| 2012/0104937 A1* | 5/2012 | Lee et al. | 313/504 |
| 2013/0242243 A1* | 9/2013 | Supon | 349/122 |
| 2014/0192491 A1* | 7/2014 | Chiang et al. | 361/750 |

FOREIGN PATENT DOCUMENTS

| | | |
|---|---|---|
| JP | 2007249014 | 9/2007 |
| TW | M368138 | 11/2009 |

OTHER PUBLICATIONS

English translation of abstract of JP 2007249014 (published Sep. 27, 2007).

English translation of abstract of JP 8-316590 (published Nov. 29, 1996).

* cited by examiner

DISPLAY DEVICE WITH FLEXIBLE SUBSTRATE AND MANUFACTURING METHOD THEREOF

BACKGROUND OF THE INVENTION

1. Field of the Invention

This invention generally relates to a display device and a manufacturing method thereof. More particularly, this invention relates to a display device with a flexible substrate and a manufacturing method thereof.

2. Description of the Prior Art

With the progress of manufacturing technique, various display devices are provided. Considering the requirement of being light, thin, short, small, and portable, the next generation display devices tend to be rollable and easily to carry, thus the flexible display devices are very common. Generally speaking, flexible display devices are soft and rollable, hence could be rolled up or folded for storage or transportation when not in use. Moreover, flexible display devices could be easily disposed on a non-planar surface to provide different visual experiences.

As the prior art shown in FIG. 1A, a conventional flexible display device 80 includes a flexible substrate 10, a display layer 30, a protecting layer 50, and an electronic unit 70. The flexible substrate 10 has a carrying surface 11. The display layer 30 is disposed on the carrying surface 11. The protecting layer 50 is disposed on the opposite side of the display layer 30 with respect to the carrying surface 11. The electronic unit 70 is disposed on the carrying surface 11. In the manufacturing process, the flexible display device 80 is usually carried by a glass substrate 20 and is de-bonded after the process is complete.

As shown in FIGS. 1B and 1C, because the flexible substrate is flexible and a space 40 exists between the display layer 30 and the electronic unit 70, over-bending of the flexible substrate 10 in local area due to its insufficient strength may occur when de-bonding the flexible display device 80 from the glass substrate 20. The local area could be, for example but not limited to, the boundary between the flexible substrate 10 and the side of the electronic unit 70 that faces the display layer 30 as shown in FIG. 1B, and the boundary between the display layer 30 and the flexible substrate 10 as shown in FIG. 1C. Thus, the conventional flexible display device 80 breaks down easily in the manufacturing process. The conventional flexible display device 80 and the manufacturing method thereof are still improvable.

SUMMARY OF THE INVENTION

It is an object of the present invention to provide a display device not easily breaking down during the manufacturing process.

It is an object of the present invention to provide a display device manufacturing method for reducing the breaking down of the display device in the manufacturing process.

The display device of the present invention includes a flexible substrate, a display layer, a protecting layer, an electronic unit, and a filling glue. The flexible substrate has a carrying surface. The display layer is disposed on the carrying surface, wherein the display layer has a side edge. The protecting layer is disposed on the opposite side of the display layer corresponding to the carrying surface. The electronic unit is disposed on the carrying surface, wherein the electronic unit forms a space with the side edge of the display layer. The filling glue is filled in the space and connected with the side edge of the display layer, the electronic unit, and the carrying surface.

The Young's modulus of the filling glue and the Young's modulus of the display layer are substantially the same or less than 15% in the difference between the two. The Young's modulus of the filling glue could be between the Young's modulus of the display layer and the Young's modulus of the flexible substrate.

The protecting layer has an end edge not exceeding the side edge of the display layer, wherein the filling glue covers a portion of the protecting layer. The filling glue covers a portion of the electronic unit. The filling glue surrounds the electronic unit. The flexible substrate has a circuit formed on the carrying surface, wherein the circuit is coupled to the circuit, wherein the circuit within the space is covered by the filling glue. The display device further comprises a circuit board coupled to the circuit, wherein the electronic unit is disposed between the circuit board and the side edge of the display layer, wherein the filling glue is filled between the electronic unit and the circuit board. The filling glue covers a portion of the circuit board.

The protecting layer has an end edge protruding over the side edge of the display layer, the portion of the end edge of the protecting layer protruding over the side edge of the display layer forms an interlayer channel with the carrying surface along the extending direction of the side edge of the display layer, a portion of the filling glue is contained in the interlayer channel. The ratio between the length of the portion of the end edge of the protecting layer protruding over the side edge of the display layer and the thickness of the display layer is between 9.31 and 12.42. The display device further comprises a first isolating glue strip at least partially disposed along one side of the interlayer channel, wherein the isolating glue strip connects the portion of the end edge of the protecting layer extending out of the side edge of the display layer with the carrying surface to isolate the filling glue within the interlayer channel from the filling glue out of the interlayer channel.

The display device further comprises a second isolating glue strip surrounding the electronic unit, wherein one end of the first isolating glue strip closer to the electronic unit extends to connect with the second isolating glue strip. The side edge of the display layer includes two protruding parts disposed apart and symmetrically, wherein the electronic unit is disposed between the protruding parts, wherein the interlayer channel and the first isolating glue strip are disposed along the sides of the protruding parts facing the electronic unit. The display device further comprises a third isolating glue strip disposed on the carrying surface, wherein the two opposite ends of the third isolating glue strip respectively connect to the first isolating glue strip extending from the side of the two protruding parts to enclose an area.

The display layer includes two protruding parts disposed apart and symmetrically, wherein the electronic unit is disposed between the protruding parts, wherein the interlayer channel is disposed along the sides of the protruding parts facing the electronic unit and is broke off at the end of the protruding parts. The display device further comprises a third isolating glue strip disposed on the carrying surface, wherein the two opposite ends of the third isolating glue strip respectively connect to the places that the interlayer channel extending along the sides of the two protruding parts breaks off to enclose an area.

The display layer includes two protruding parts disposed apart and symmetrically, wherein the electronic unit is disposed between the protruding parts, wherein the interlayer channel is disposed along the sides of the protruding parts facing the electronic unit and is broke off at the end of the protruding parts.

The protecting layer does not cover the side edge of the display layer, and the filling glue covers a portion of a top surface of the display layer that is uncovered by the protecting layer. The ratio between the length of the portion of the side edge of the display layer extending out of the end edge of the protecting layer to the thickness of the display layer is between 18.63 and 31.05.

The filling glue includes a glue body and a film. The glue body is filled in the space and connected with the side edge of the display layer, the electronic unit, and the carrying surface, wherein the glue body is capable of absorbing energy to transform from liquid state to solid state. The film covers and adheres to a portion of the protecting layer and the glue body.

The display device manufacturing method, comprising: forming a cutting line on a carrying surface of a flexible substrate; disposing a display layer on the carrying surface, wherein the display layer has a side edge; forming a protecting layer on the opposite side of the display layer corresponding to the carrying surface, wherein the protecting layer has an end edge; disposing an electronic unit on the carrying surface to form a space with the display layer, wherein the electronic unit and the display layer are disposed at the same side of the cutting line; filling a filling glue in the space, wherein the filling glue is connected with the side edge of the display layer, the electronic unit, and the carrying surface; and taking a portion of the flexible substrate carrying the display layer and the electronic unit out form the cutting line.

The step of forming the protecting layer includes making the end edge of the protecting layer not exceed the side edge of the display layer, wherein the step of filling the filling glue includes making the filling glue partially overflow the space and covers the protecting layer. The step of filling the filling glue includes making the filling glue partially overflow the space and covers the electronic unit. The step of filling the filling glue includes making the filling glue surround the electronic unit. The step of forming the protecting layer includes making the end edge of the protecting layer extend out of the side edge of the display layer, wherein the portion of the end edge of the protecting layer extending out of the side edge of the display layer forms an interlayer channel with the carrying surface along the extending direction of the side edge of the display layer, wherein the step of filling the filling glue includes making the filling glue contained in the interlayer channel.

The method further comprises disposing a first isolating glue strip at least partially along one side of the interlayer channel, wherein the isolating glue strip connects the portion of the end edge of the protecting layer extending out of the side edge of the display layer with the carrying surface to isolate the filling glue within the interlayer channel from the filling glue out of the interlayer channel, wherein the viscosity of the first isolating glue strip before hardening is greater than the viscosity of the filling glue before hardening. The step of filling the filling glue includes determining the filling amount of the filling glue to control the amount of the filling glue filled into the interlayer channel. The method further comprises disposing a second isolating glue strip surrounding the electronic unit, wherein one end of the first isolating glue strip closer to the electronic unit extends to connect with the second isolating glue strip, wherein the viscosity of the second isolating glue strip before hardening is greater than the viscosity of the filling glue before hardening.

The side edge of the display layer includes two protruding parts disposed apart and symmetrically, wherein the electronic unit is disposed between the protruding parts, wherein the interlayer channel and the first isolating glue strip are disposed along the sides of the protruding parts facing the electronic unit, wherein the method further comprising disposing a third isolating glue strip on the carrying surface, wherein the two opposite ends of the third isolating glue strip respectively connect to the first isolating glue strip extending from the side of the two protruding parts to enclose an area, wherein the viscosity of the third isolating glue strip before hardening is greater than the viscosity of the filling glue before hardening.

The step of forming the protecting layer includes: making one end of the interlayer channel extend toward the cutting line; and cutting the protecting layer and the display layer to even at or close to the intersection of the interlayer channel and the cutting line to break off the interlayer channel. The side edge of the display layer includes two protruding parts disposed apart and symmetrically, the electronic unit is disposed between the protruding parts, the interlayer channel is disposed along the sides of the protruding parts facing the electronic unit and is broke off at the bottom end of the protruding parts, wherein the method further comprising disposing a third isolating glue strip on the carrying surface, wherein the two opposite ends of the third isolating glue strip respectively connect to the places that the interlayer channel extending along the sides of the two protruding parts breaks off to enclose an area, the viscosity of the third isolating glue strip before hardening is greater than the viscosity of the filling glue before hardening.

The step of forming the protecting layer includes: making one end of the interlayer channel extend toward the cutting line; and forming an opening on the protecting layer at or close to the intersection of the interlayer channel and the cutting line to break off the interlayer channel.

The step of forming the protecting layer includes making the end edge of the protecting layer shrink from the side edge of the display layer, wherein the step of filling the filling glue includes making the filling glue cover the display layer. The step of filling the filling glue includes: filling a glue body in the space and connecting with the side edge of the display layer, the electronic unit, and the carrying surface; applying energy onto the glue body to transform the glue body from liquid state to solid state; and covering and adhering a film to a portion of the protecting layer and the glue body.

DETAILED DESCRIPTION OF THE PREFERRED EMBODIMENT

The present invention provides a display device and a manufacturing method thereof, wherein the display device is a flexible display using a flexible substrate. More particularly, the flexible substrate is made of materials such as tin, 430 stainless steel, or polyimide (PI). The flexible display is a display device having flexibility such as OLED display or electronic paper.

Figure 1A:
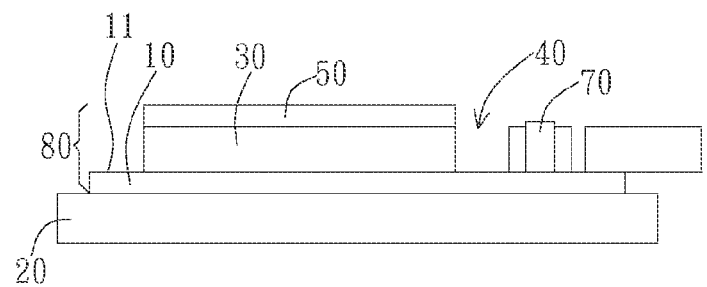
FIGS. 1A to 1C are schematic views of prior arts.
Figure 1B:
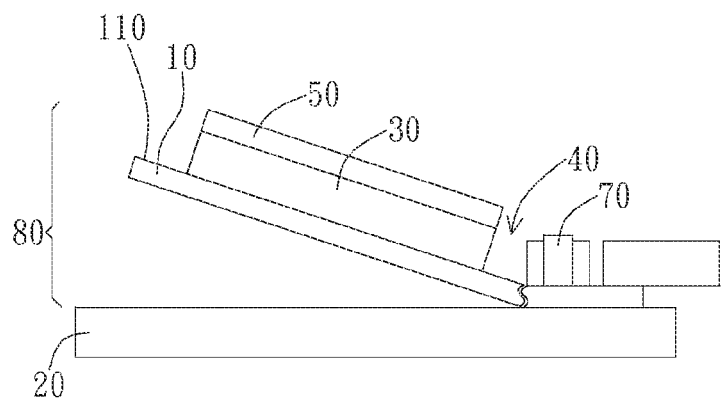
Figure 1C:
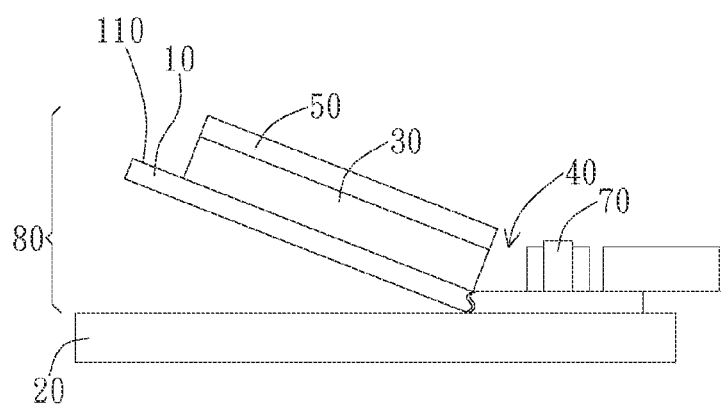
Figure 2A:
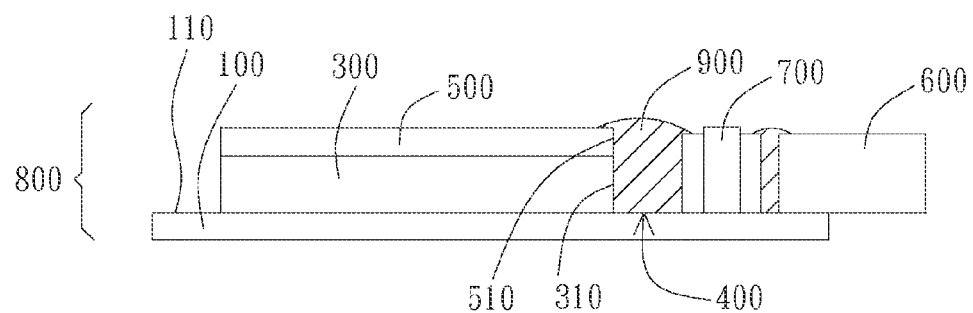
FIG. 2A is a schematic view of the preferred embodiment of the display device of the present invention.
Figure 2B:
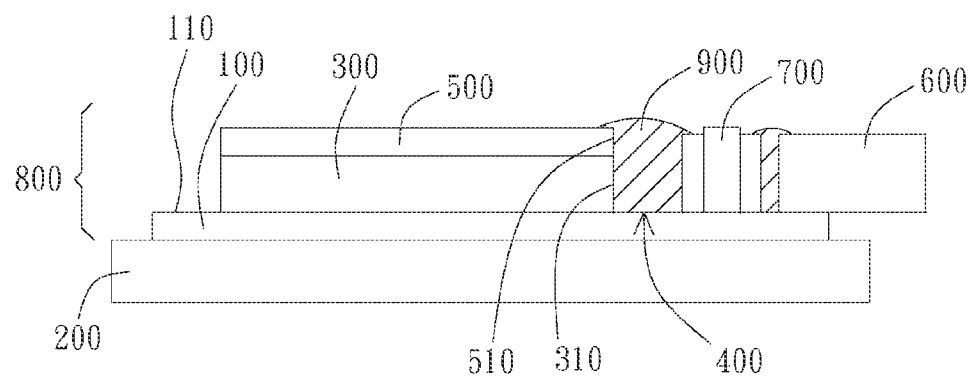
FIG. 2B is a schematic view of an embodiment of the display device of the present invention disposed on a carrying substrate.
Figure 3:
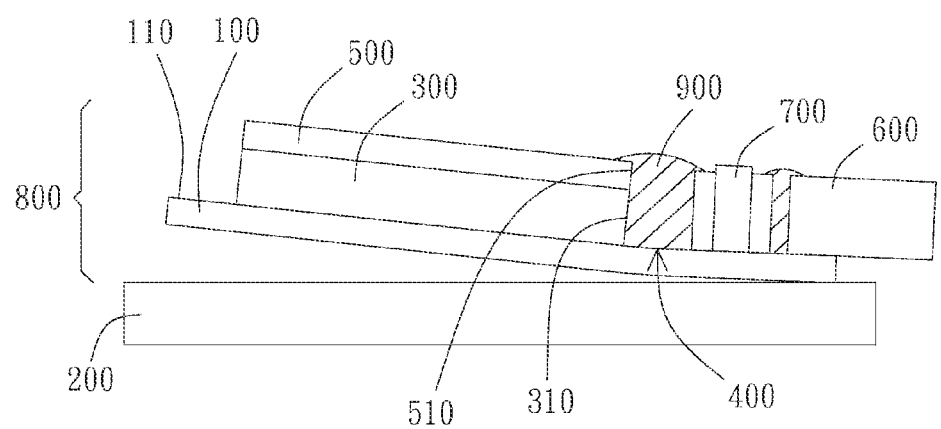
FIG. 3 is a schematic view of an embodiment of the display device of the present invention de-bonded from the carrying substrate.

As a preferred embodiment shown in FIG. 2A, a display device 800 of the present invention includes a flexible substrate 100, a display layer 300, a protecting layer 500, an electronic unit 700, and a filling glue 900. The flexible substrate 100 has a carrying surface 110. The display layer 300 is disposed on the carrying surface 110, and the display layer 300 has a side edge 310. The protecting layer 500 is disposed on the opposite side of the display layer 300 with respect to the carrying surface 110. The electronic unit 700 is disposed on the carrying surface 110 adjacent to the side edge 310 of the display layer 300, wherein a space 400 is formed between the electronic unit 700 and the side edge 310 of the display layer 300. The filling glue 900 is filled in the space 400 and contacted with the side edge 310 of the display layer 300, the electronic unit 700, and the carrying surface 110. In other words, the side edge 310 of the display layer 300, the carrying surface 110, and one side of the electronic unit 700 respectively form three faces of the space 400, wherein the filling glue 900 filled in the space 400 is contacted with the three faces. The filling glue 900 is a glue body capable of absorbing energy to transform from liquid state to solid state. In other words, the filling glue 900 is a liquid that can be solidified by methods such as UV light illuminating or heating. More particularly, in the manufacturing process, the filling glue 900 is filled into the space 400 in liquid state and then solidified. During the manufacturing process, as shown in FIG. 2B, the display device 800 is preferably disposed on a carrying substrate 200. When the carrying substrate is a light-transmittable substrate such as a glass substrate, light is able to transmit through the carrying substrate 200 to solidify the filling glue 900.

Since the space 400 between the display layer 300 and the electronic unit 700 is filled with the filling glue 900, over-bending of the flexible substrate 100 in local area due to its insufficient strength can be prevented when the flexible display device 800 is de-bonded from the carrying substrate 200, which can be made of glass or aluminum, for example. The local area could be, for example but not limited to, the boundary between the side edge 310 of the display layer 300 and the flexible substrate 100, and the boundary between the flexible substrate 100 and the side of the electronic unit 700 that faces the side edge 310 of the display layer 300. Thus, the breaking down of the display device 800 in the manufacturing process can be reduced.

The Young's modulus of the filling glue 900 and the Young's modulus of the display layer 300 are substantially the same or have a difference less than 15% therebetween, or the Young's modulus of the filling glue 900 could be between the Young's modulus of the display layer 300 and the Young's modulus of the flexible substrate 100.

More specifically, the filling glue 900 is preferably an object having a certain elasticity, hence the display layer 300 and the protecting layer 500 can shift toward the space 400 to a limited extent. In other words, the display device 800 can bend to a limited extent, without losing flexibility due to the disposition of the filling glue 900 in the space 400. On the other hand, by connecting with the side edge 310 of the display layer 300, the electronic unit 700, and the carrying surface 110, the position of the filling glue 900 with respect to the side edge 310 of the display layer 300, the electronic unit 700, and the carrying surface 110 can be maintained. As such, the flexible substrate 100 can further form a continuous unity with the display layer 300, the electronic unit 700, and the filling glue 900 by such a connection relationship among them.

As the preferred embodiment shown in FIG. 2A, the protecting layer 500 has an end edge 510 not exceeding the side edge 310 of the display layer 300, and the filling glue 900 covers a portion of the top surface of the protecting layer 500. More particularly, in the preferred embodiment, the end edge 510 of the protecting layer 500 is flush with the side edge 310 of the display layer 300, and the filling glue 900 covers the end edge 510 of the protecting layer 500 that is close to the electronic unit 700, i.e. covers the top of the side edge 310 of the display layer 300. By contacting the filling glue 900 with the top surface of the protecting layer 500, the strength of the unity structure can be further enhanced. Similarly, the filling glue 900 preferably covers a portion of the top surface of the electronic unit 700 to reduce the bending of the flexible substrate 100. In other embodiments, however, in order to decrease the material cost of the filling glue 900 or to control the filling amount of the filling glue 900, the filling glue 900 can be filled in the space 400 only, instead of covering the top surface of the protecting layer 500 and/or the electronic unit 700.

Figure 4:
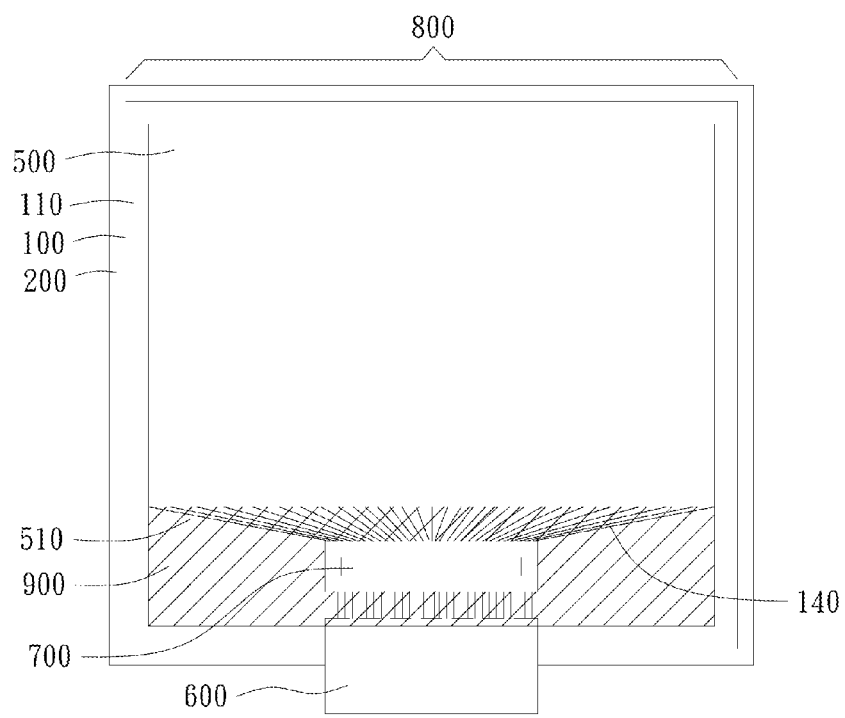
FIG. 4 is a top view of the preferred embodiment of the display device of the present invention.

As the preferred embodiment shown in FIG. 4, the filling glue 900 surrounds the electronic unit 700. A circuit 140 is formed on the carrying surface 110 for coupling the display layer 300 to the electronic unit 700. The circuit 140 within the space 400 (shown in FIG. 2) is covered by the filling glue 900 to decrease the possibility of oxidization or damage of the circuit 140 caused by contacting with oxygen, moisture, or other materials. As the preferred embodiment shown in FIGS. 2B and 4, the display device 800 further includes a circuit board 600 coupled to the circuit 140 (shown in FIG. 4), wherein the electronic unit 700 is disposed between the circuit board 600 and the side edge 310 of the display layer 300 (shown in FIG. 2B). Similarly, the filling glue 900 is filled between the electronic unit 700 and the circuit board 600 to decrease the possibility of oxidization or damage of the circuit 140 caused by contacting with oxygen, moisture, or other materials. The filling glue 900 covers a portion of the top surface of the circuit board 600 to decrease the bending of the flexible substrate 100.

Figure 5:
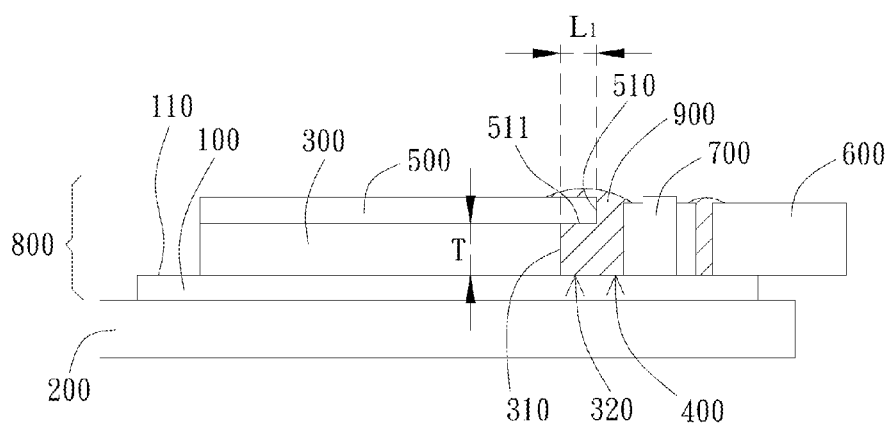
FIG. 5 is a schematic view of an embodiment of the display device of the present invention, wherein the end edge of the protecting layer extends out of the side edge of the display layer.

In a different embodiment, the position of the end edge 510 of the protecting layer 500 with respect to the side edge 310 of the display layer 300 can differ in accordance with different design requirements. As shown in FIG. 5, the protecting layer 500 includes an end edge 510 of the protecting layer 500 protruding over the side edge 310 of the display layer 300. The portion of the protecting layer 500 that protrudes over the side edge 310 of the display layer 300 forms an interlayer channel 320 with the carrying surface 110 along the extending direction of the side edge 310 of the display layer 300, wherein a portion of the filling glue 900 is contained in the interlayer channel 320. More particularly, the side edge 310 of the display layer 300, a bottom side 511 of the protecting layer 500 that protrudes over the of the display layer 300, and the carrying surface 110 of the flexible substrate 100 respectively form three faces of the interlayer channel 320. In the manufacturing process, when liquid filling glue 900 contacts a portion of the interlayer channel 320, it flows to the other portions of the interlayer channel 320 due to capillary attraction. The ratio of the length $L_1$ of the portion of the protecting layer 500 that protrudes over the side edge 310 of the display layer 300 to the thickness T of the display layer 300 is preferably between 9.31 and 12.42 to obtain better capillary attraction.

Figure 6A:
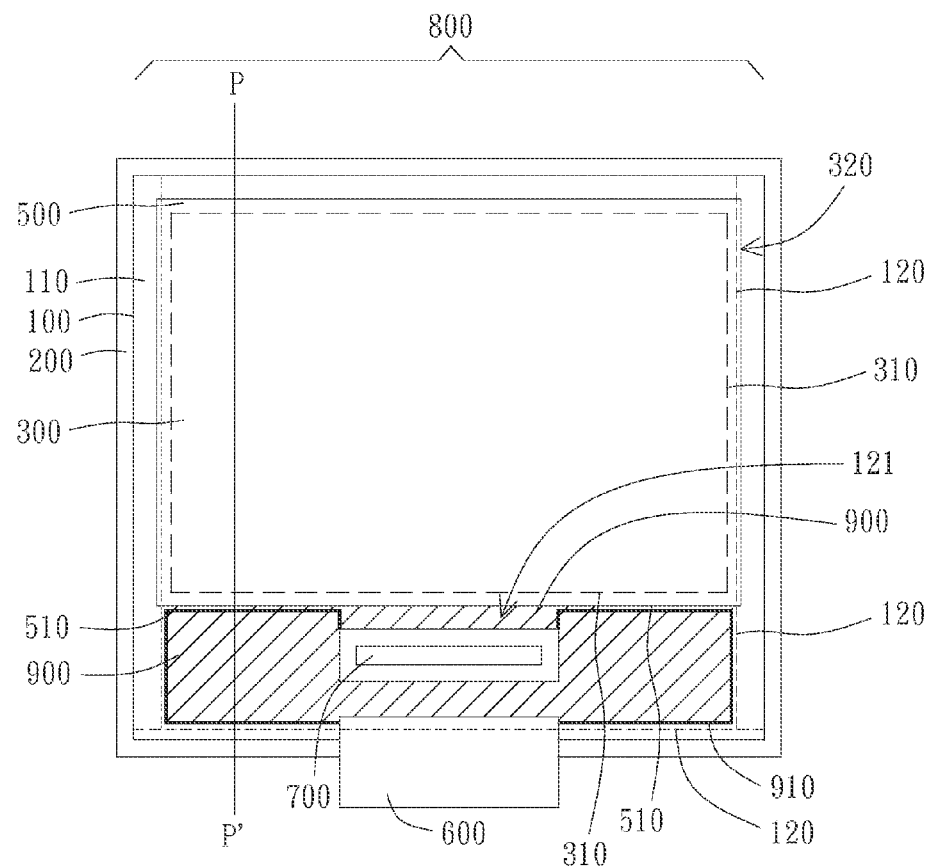
FIG. 6A is a schematic view of an embodiment of the display device of the present invention after the filling of the filling glue.
Figure 6B:
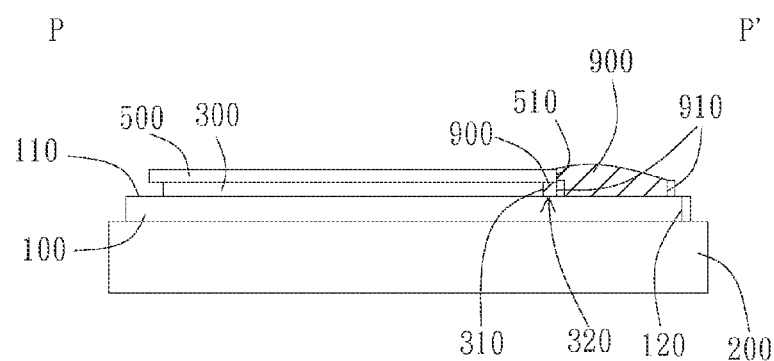
FIG. 6B is a cross-sectional view of an embodiment of the display device of the present invention after the filling of the filling glue.

As the top view of the embodiment shown in FIG. 6A and the corresponding P-P' cross-sectional view shown in FIG. 6B, the end edge 510 of the protecting layer 500 protrudes over the side edge 310 of the display layer 300, and the display device 800 further includes a first isolating glue strip 910 at least partially disposed along one side of the interlayer channel 320. The isolating glue strip 910 connects the protecting layer 500 that protrudes over the side edge 310 of the display layer 300, such as the end edge 510 of the protecting layer 500, with the carrying surface 110 to isolate the filling glue 900 within the interlayer channel 320 from the filling glue 900 outside the interlayer channel 320. The viscosity of the first isolating glue strip 910 before hardening is greater than the viscosity of the filling glue 900 before hardening. More particularly, in the manufacturing process, at least one cutting line 120 will be formed on the carrying surface 110 before filling the filling glue, which is benefit to separate and de-bond the plurality products (i.e., the display devices) from the carrying substrate 200 after the process is complete. In other words, no cutting line will be shown on the products. When liquid filling glue 900 contacts a portion of the interlayer channel 320, it flows to other portions of the interlayer channel 320 due to capillary attraction. Thus, the cutting line 120 might be covered by the filling glue 900 and the separating and de-bonding of the plurality products (i.e., the display devices) from the carrying substrate 200 after the process is complete might be effected. The first isolating glue strip 910 can prevent the filling glue 900 from flow to and cover the cutting line 120. Further, as the embodiment shown in FIG. 6A, one end of the first isolating glue strip 910 close to the electronic unit 700 extends to connect electronic unit 700. By extending and connecting to the electronic unit 700, the first isolating glue strip 910 forms a first glue filling area 121 on the carrying surface 110 for filling the filling glue 900 in the manufacturing process. When liquid filling glue 900 contacts a portion of the interlayer channel 320, it flows to other portions of the interlayer 320 due to capillary attraction. Since the range of the first glue filling area 121 is fixed, the filling amount of the liquid filling glue can be controlled by directly filling the filling glue 900 into the first glue filling area 121, to prevent the filling glue 900 from flowing to and covering the cutting line 120 due to excess filling amount of the filling glue 900.

In different embodiments, the shape of the display can differ in accordance with the design requirements. For example, as the embodiment shown in FIG. 7, the display layer 300 includes two protruding parts 311 disposed apart and symmetrically, wherein the electronic unit 700 is disposed between the protruding parts 311. In other words, the area of the display layer 300 is increased by the disposition of the protruding parts 311, hence the display area of the display device 800 can be increased.

Figure 7:
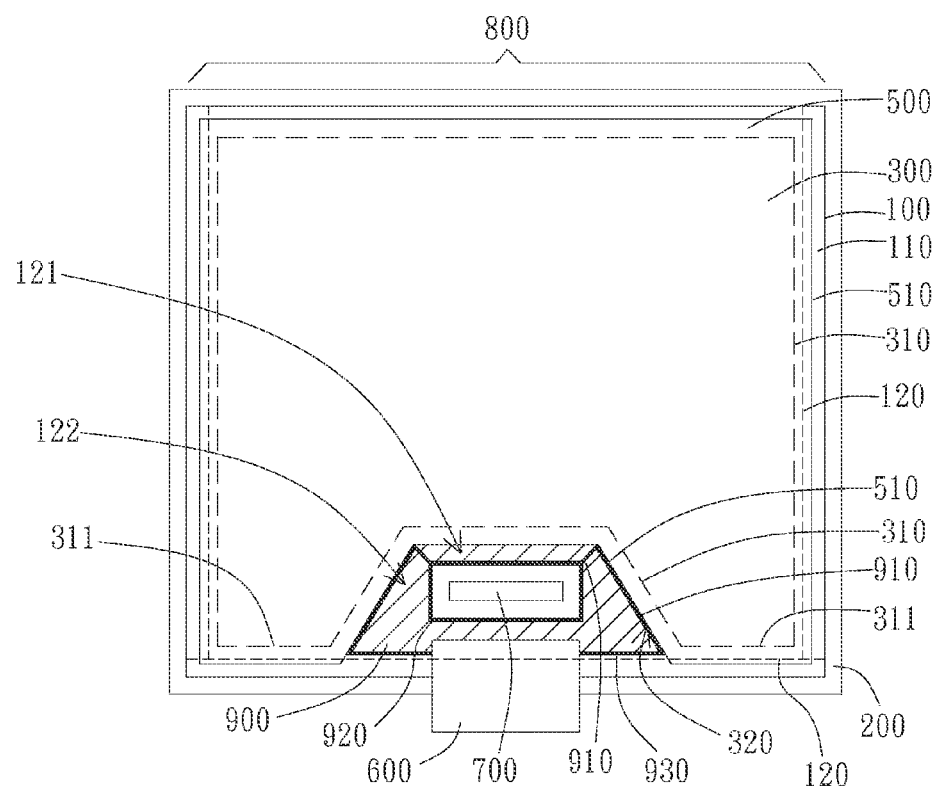
FIG. 7 is a schematic view of an embodiment of the display device of the present invention, wherein the side edge of the display layer includes two protruding parts disposed apart and facing to each other.

As the embodiment shown in FIG. 7, the interlayer channel 320 and the first isolating glue strip 910 are disposed along the sides of the protruding parts 311 that face the electronic unit 700. The display device 800 further includes a second isolating glue strip 920 surrounding the electronic unit 700, wherein the viscosity of the second isolating glue strip 920 before hardening is greater than the viscosity of the filling glue 900 before hardening. One end of the first isolating glue strip 910 closer to the electronic unit 700 extends to connect with the second isolating glue strip 920. By extending and connecting to the second isolating glue strip 920, the first isolating glue strip 910 forms a first glue filling area 121 on the carrying surface 110 for filling the filling glue 900 in the manufacturing process. More particularly, when liquid filling glue 900 contacts a portion of the interlayer channel 320, it flows to other portions of the interlayer 320 due to capillary attraction. Since the range of the first glue filling area 121 is fixed, the filling amount and the distribution area of the liquid filling glue can be controlled by directly filling the filling glue 900 into the first glue filling area 121.

As the embodiment shown in FIG. 7, the display device 800 further includes a third isolating glue strip 930 disposed in the area enclosed by the cutting lines 120 on the carrying surface 110, wherein the third isolating glue strip 930 does not overlap the cutting line 120. Two opposite ends of the third isolating glue strip 930 respectively connect to the first isolating glue strips 910 extending along the side of the two protruding parts 311 to enclose an area, such as the second glue filling area 122 shown in FIG. 7. The viscosity of the third isolating glue strip 930 before hardening is greater than the viscosity of the filling glue 900 before hardening. Since the range of the second glue filling area 122 is fixed, the filling amount and the distribution area of the liquid filling glue can be controlled by directly filling the filling glue 900 into the second glue filling area 122.

Figure 8A:
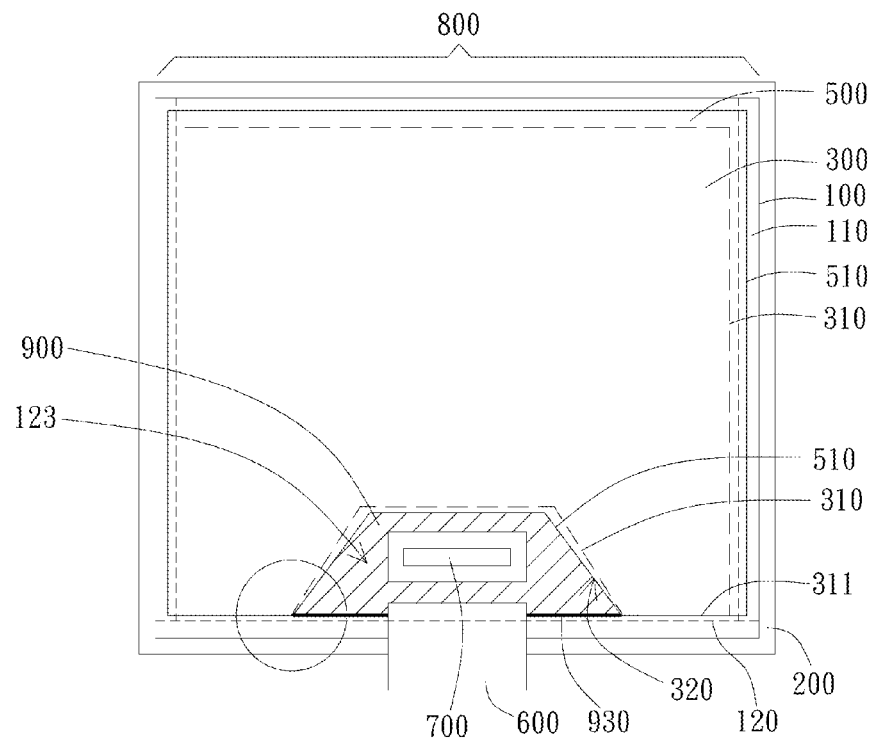
FIGS. 8A and 8B are schematic views of an embodiment of a display device of the present invention.
Figure 8B:
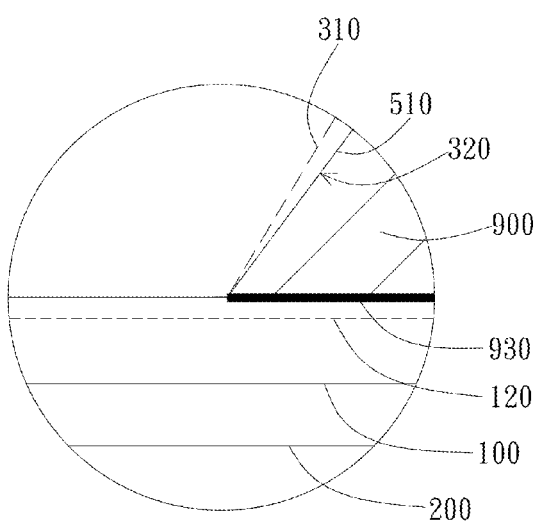

In different embodiments, the protecting layer 500 is flush with the display layer 300 at or close to the intersection of the interlayer channel 320 and the cutting line 120 to interrupt the interlayer channel 320, preventing the filling glue 900 from flowing to and covering the cutting line 120. As the embodiment shown in FIGS. 8A and 8B, wherein FIG. 8B is a partial view of FIG. 8A, a cutting line 120 is formed on the carrying surface 110, and one end of the interlayer channel 320 extends toward the cutting line 120. The display layer 300 includes two protruding parts 311 disposed apart and symmetrically, wherein the electronic unit 700 is disposed between the protruding parts 311. The interlayer channel 320 is disposed along the sides of the protruding parts 311 facing the electronic unit 700 and stops at the bottom end of the protruding parts 311. More particularly, as shown in FIG. 5, the bottom side 511 of the protecting layer 500 that protrudes over the display layer 300, the side edge 310 of the display layer 300, and the carrying surface 110 of the flexible substrate 100 respectively form three faces of the interlayer channel 320. However, as shown in FIGS. 8A and 8B, the end edge 510 of the protecting layer 500 is flush with the side edge 310 of the display layer 300 at the bottom end of the protruding parts 311 before the interlayer channel 320 intersects the cutting line 120. That is, the end edge 510 of the protecting layer 500 is aligned with the side edge 310 of the display layer 300 in this position. As such, one face (the bottom side 511 of the end edge 510 of the protecting layer 500 protruding over the side edge 310 of the display layer 300) of forming the interlayer channel 320 no longer exists, therefore the interlayer channel 320 is interrupted at this position. The display device 800 further includes a third isolating glue strip 930 disposed on the carrying surface 110 and extending along the sides of the two protruding parts 311, wherein the two opposite ends of the third isolating glue strip 930 respectively connect to where the interlayer channel 320 is interrupted to enclose an area, e.g. the third glue filling area 123 shown in FIG. 8A. The viscosity of the third isolating glue strip 930 before hardening is greater than the viscosity of the filling glue 900 before hardening. Since the range of the third glue filling area 123 is fixed, the filling amount and the distribution area of the liquid filling glue can be controlled by directly filling the filling glue 900 into the third glue filling area 123.

Figure 8C:
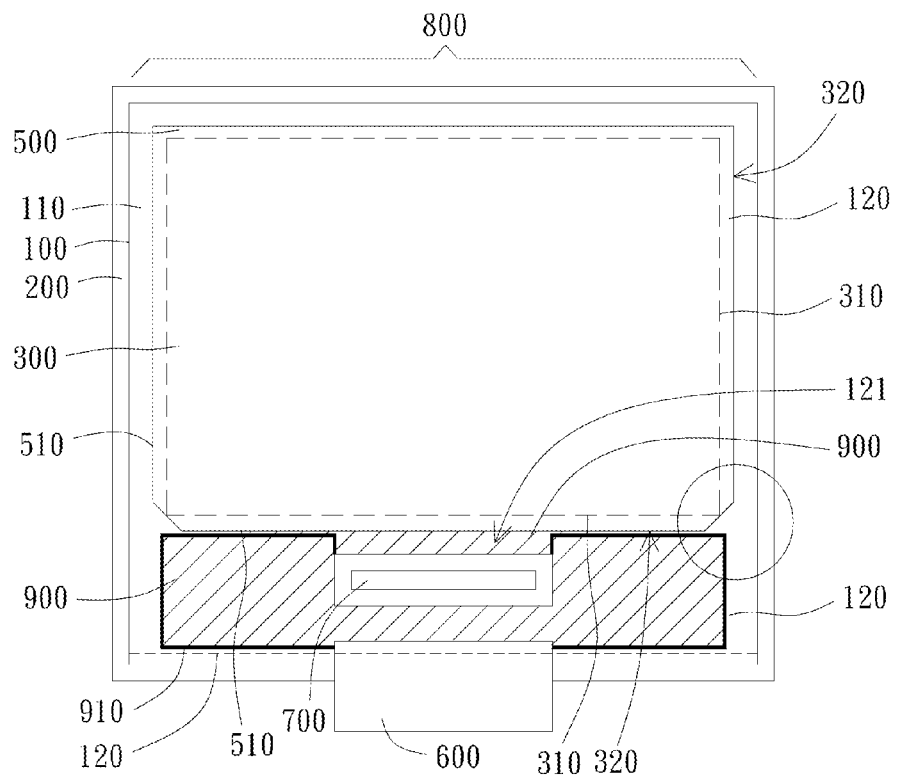
FIGS. 8C and 8D are schematic views of another embodiment of a display device of the present invention.
Figure 8D:
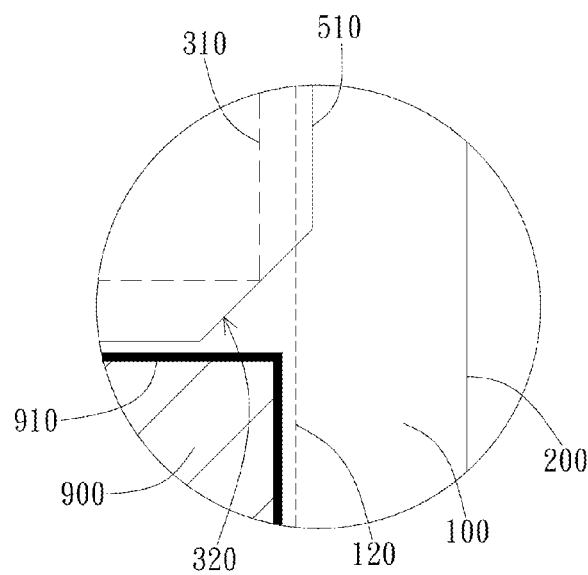

The above approach that the protecting layer 500 is flush with the display layer 300 at a place close to the intersection of the interlayer channel 320 and the cutting line 120 to interrupt the interlayer channel 320 can also be applied to the embodiment having no protruding parts shown in FIGS. 8C and 8D, wherein FIG. 8D is a partial view of FIG. 8C. In this embodiment, bevel angles are formed at two corners in the bottom of the protecting layer 500, wherein the protecting layer 500 is flush with the display layer 300 at the beveled corners and close to the intersection of the interlayer channel 320 and the cutting line 120 to interrupt the interlayer channel 320. Accordingly, this approach not only controls the amount of the filling glue 900 filled in to the first glue filling area 121 in the process, but also prevents the filling glue 900 from flowing to and covering the cutting line 120 by interrupting the interlayer channel 320.

Figure 9A:
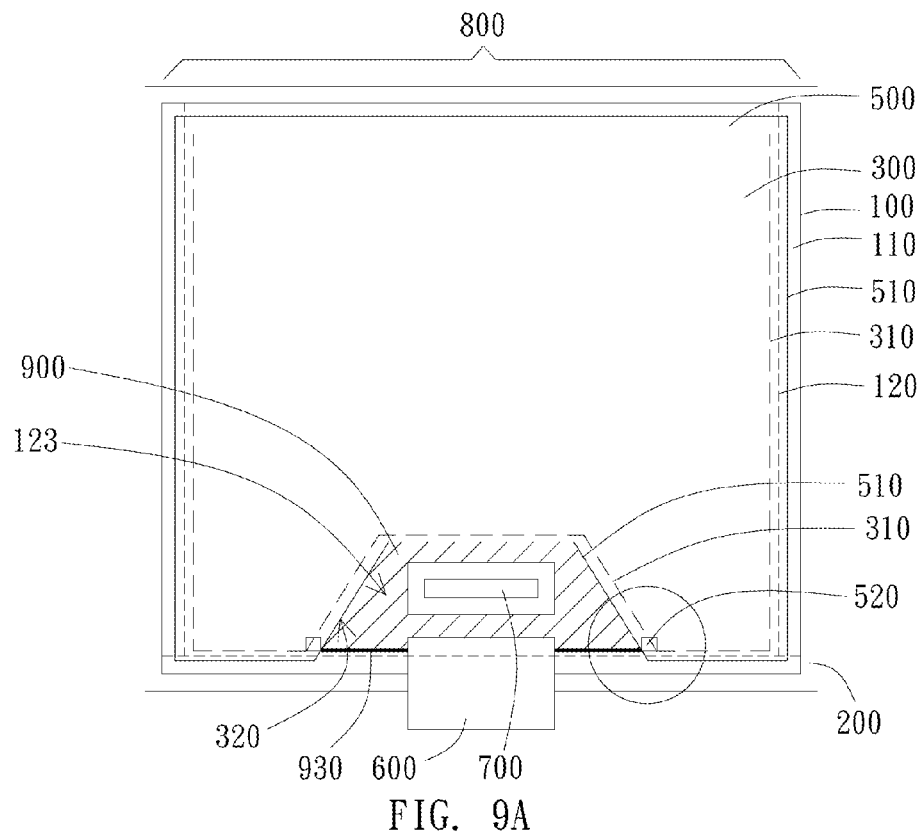
FIGS. 9A and 9B are schematic views of another embodiment of a display device of the present invention.
Figure 9B:
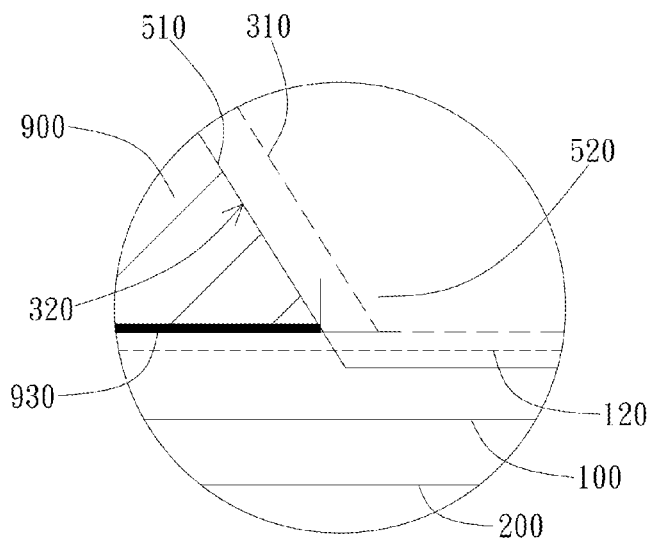

In different embodiments, the protecting layer 500 forms at least one opening 520 at or close to the intersection of the interlayer channel 320 and the cutting line 120 to interrupt the interlayer channel 320 for preventing the filling glue 900 from flowing to and covering the cutting line 120. More particularly, as the embodiment shown in FIGS. 9A and 9B, wherein FIG. 9B is a partial view of FIG. 9A, a cutting line 120 is formed on the carrying surface 110, wherein one end of the interlayer channel 320 extends toward the cutting line 120, wherein the protecting layer 500 forms an opening 520 at or close to the intersection of the interlayer channel 320 and the cutting line 120. As shown in FIG. 5, the bottom side 511 of the protecting layer 500 that protrudes over the side edge 310 of the display layer 300, the side edge 310 of the display layer 300, and the carrying surface 110 respectively form three faces of the interlayer channel 320. Forming the opening 520 will cause that one face (the bottom side 511 of the protecting layer 500 protruding over the display layer 300) of forming the interlayer channel 320 no longer exists, the interlayer channel 320 is interrupted, and therefore the capillary attraction will be interrupted also. The display layer 300 includes two protruding parts 311 disposed apart and symmetrically, wherein the electronic unit 700 is disposed between the protruding parts 311. The interlayer channel 320 is disposed along the sides of the protruding parts 311 facing the electronic unit 700 and is interrupted by the opening 520 at the bottom end of the protruding parts 311. The display device 800 further includes a third isolating glue strip 930 disposed on the carrying surface 110, wherein the two opposite ends of the third isolating glue strip 930 respectively connect to the openings 520 at the bottom end of the protruding parts 311 to enclose an area, e.g. the third glue filling area 123 shown in FIG. 9A. The viscosity of the third isolating glue strip 930 before hardening is greater than the viscosity of the filling glue 900 before hardening. Since the range of the third glue filling area 123 is fixed, the filling amount and the distribution area of the liquid filling glue can be controlled by directly filling the filling glue 900 into the third glue filling area 123.

Figure 10A:
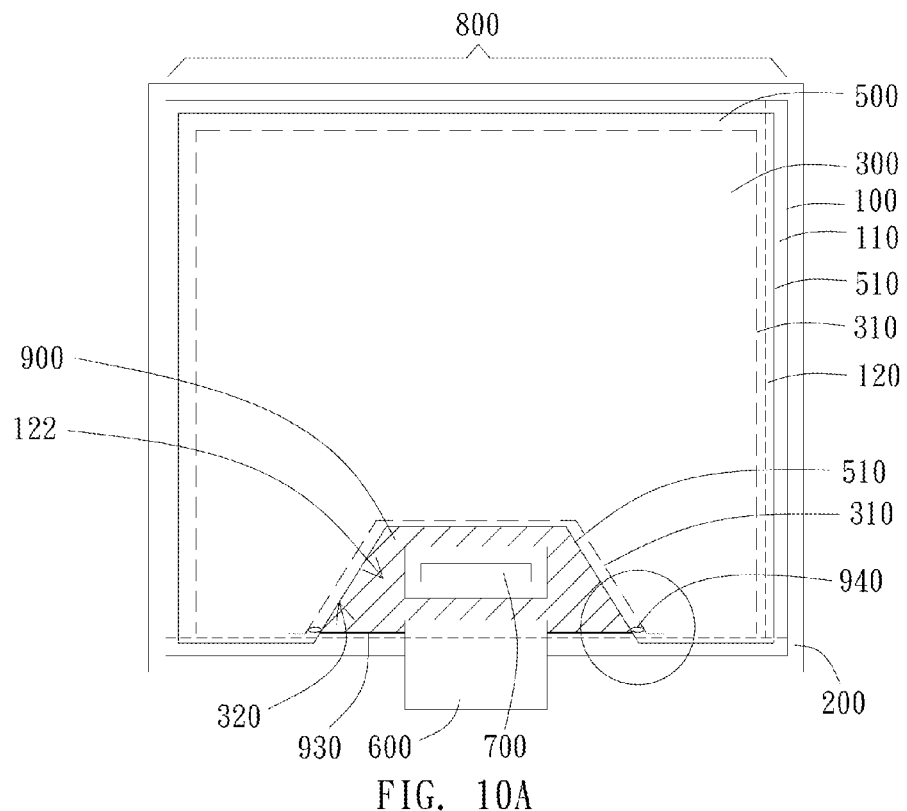
FIGS. 10A and 10B are schematic views of another embodiment of a display device of the present invention.
Figure 10B:
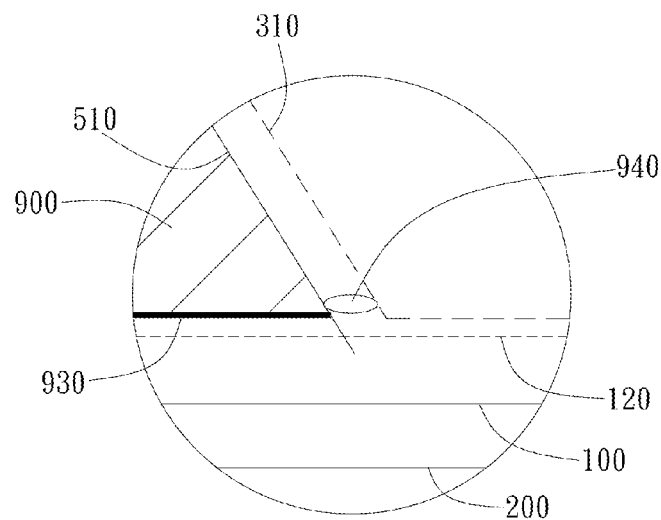

In different embodiments, the display device 800 further includes an isolating glue block 940 disposed at or close to the intersection of the interlayer channel 320 and the cutting line 120 on the carrying surface 110 to interrupt the interlayer channel 320 for preventing the filling glue 900 from flowing to and covering the cutting line 120. More particularly, as the embodiment shown in FIGS. 10A and 10B, wherein FIG. 10B is a partial view of FIG. 10A, a cutting line 120 is formed on the carrying surface 110, wherein one end of the interlayer channel 320 extends toward the cutting line 120. The isolating glue block 940 is disposed before the intersection of the interlayer channel 320 and the cutting line 120 to interrupt the interlayer channel 320. The viscosity of the isolating glue block 940 before hardening is greater than the viscosity of the filling glue 900 before hardening.

Figure 11A:
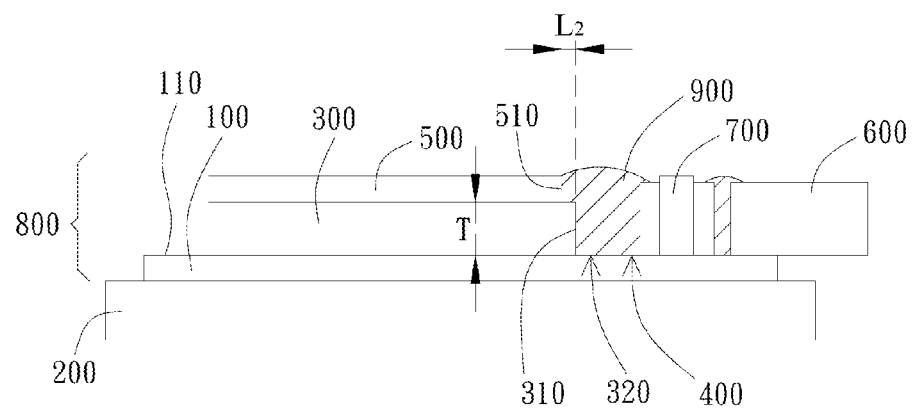
FIGS. 11A-11C are schematic views of different embodiments of the display device of the present invention, wherein the protecting layer retreats from the side edge of the display layer.

As a different embodiment shown in FIG. 11A, the protecting layer 500 of the display device 800 has an end edge 510, wherein the side edge 310 of the display layer 300 exceeds the end edge 510 of the protecting layer 500, and the filling glue 900 covers a portion of the top surface of the display layer 300. In other words, the space 400 is completely exposed. Thus, the filling glue 900 can be disposed more conveniently. The ratio of the length $L_2$ of the portion of the side edge 310 of the display layer 300 exceeding the end edge 510 of the protecting layer 500 and the thickness T of the display layer 300 is between 18.63 and 31.05 for enhancing the fixing effect between the filling glue 900 and the covered portion of the display layer 300.

Figure 11B:
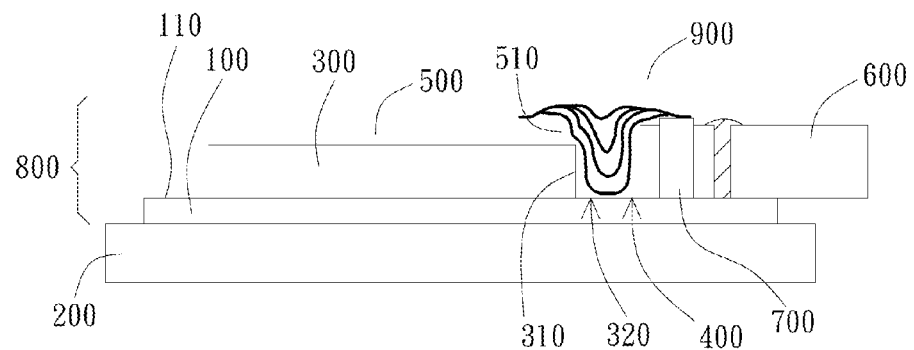

In the preferred embodiment, the filling glue is a glue body capable of absorbing energy to transform from liquid state to solid state. However, as the different embodiment shown in FIG. 11B, the filling glue 900 can be a film capable of being bent and inserted into to the space 400. The film could be implemented as a plurality of films (as shown in FIG. 11B) or a single film. The film preferably forms a concave part in the space 400 when the film is inserted into the space 400, wherein the top face of the concave part is as high as the protecting layer 500 to facilitate a vacuum sucking action in the manufacturing process.

Figure 11C:
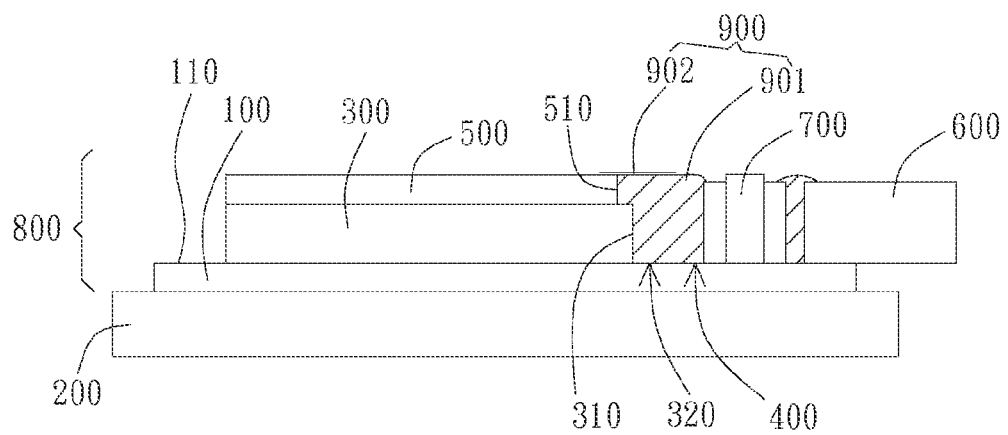

As the different embodiment shown in FIG. 11C, the filling glue 900 includes a glue body 901 and a film 902. The glue body 901 is filled in the space 400 and connected with the side edge 310 of the display layer 300, the electronic unit 700, and the carrying surface 110, wherein the glue body 901 is capable of absorbing energy to transform from liquid state to solid state. The film 902 covers and adheres to a portion of the top surface of the protecting layer 500 and the top surface of the glue body 901 for enhancing the fixing effect between the protecting layer 500 and the glue body 901.

Figure 12:
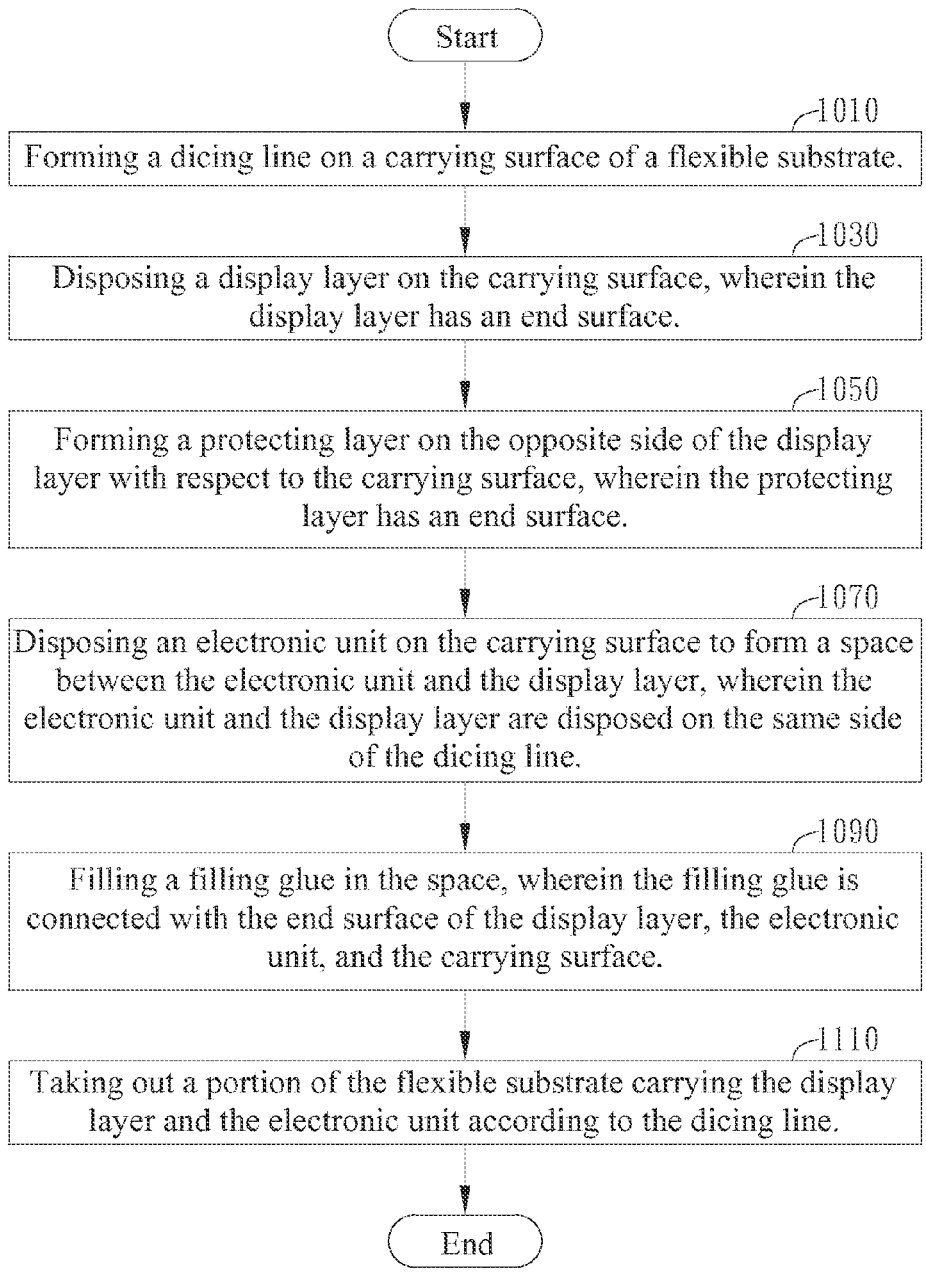
FIG. 12 is a flow chart of the preferred embodiment of the display device manufacturing method of the present invention.

As a preferred embodiment shown in FIG. 12, the display device manufacturing method of the present invention includes the following steps.

Step 1010 involves forming a cutting line on a carrying surface of a flexible substrate. More particularly, a flexible substrate 100 disposed on the carrying substrate 200 as shown in FIG. 2 is provided, wherein the cutting lines 120 on the carrying surface 110 of the flexible substrate shown in FIG. 6A are formed by approaches such as laser cutting.

Step 1030 involves disposing a display layer on the carrying surface, wherein the display layer has a side edge. More particular, the display layer 300 having a side edge 310 is disposed on the carrying surface 110 as shown in FIG. 2 by semiconductor processing steps such as deposition, photolithography, etching, thermal processes, etc.

Step 1050 involves forming a protecting layer on the opposite side of the display layer with respect to the carrying surface, wherein the protecting layer has an end edge. More particular, the protecting layer 500 having an end edge 510 is disposed on the opposite side of the display layer 300 with respect to the carrying surface 110 as shown in FIG. 2 by semiconductor processing steps such as deposition, photolithography, etching, thermal processes, etc.

Step 1070 involves disposing an electronic unit on the carrying surface to form a space between the electronic unit and the display layer, wherein the electronic unit and the display layer are disposed on the same side of the cutting line. More particular, the electronic unit 700 is disposed on the carrying surface 110 as shown in FIG. 2 by semiconductor processing steps such as deposition, photolithography, etching, thermal processes, etc. As shown in FIG. 6A, the electronic unit 700 and the display layer 300 are on the same side of the cutting line 120.

Step 1090 involves filling a filling glue in the space, wherein the filling glue is connected with the side edge of the display layer, the electronic unit, and the carrying surface. More particularly, the filling glue can be a liquid that can be solidified by approaches such as UV light illuminating or heating. In this step, the filling glue 900 is filled into the space 400 by approaches such as injecting, dripping, spraying, and then be solidified.

Step 1110 involves taking out a portion of the flexible substrate carrying the display layer and the electronic unit according to the cutting line. More particularly, the flexible substrate 100 as well as the carried display layer 300 and the electronic unit 700 in the area enclosed by the cutting line 120 as shown in FIG. 6A is taken out.

In the preferred embodiment, step 1050 includes making the end edge 510 of the protecting layer 500 not exceed the side edge 310 of the display layer 300 as shown in FIG. 2. Step 1090 includes making the filling glue 900 partially overflow the space 400 and covers a portion of the top surface of the protecting layer 500 as shown in FIG. 2. Step 1090 includes making the filling glue 900 partially overflow the space 400 and covers a portion of the top surface of the electronic unit 700 as shown in FIG. 2. Step 1090 includes making the filling glue 900 surround the electronic unit 700 as shown in FIG. 4.

In different embodiments, step 1050 includes making the end edge 510 of the protecting layer 500 extend out of the side edge 310 of the display layer 300, wherein the portion of the end edge 510 of the protecting layer 500 that extends out of the side edge 310 of the display layer 300 forms an interlayer channel 320 with the carrying surface 110 along the extending direction of the of the display layer 300 310 as shown in FIG. 5. Step 1090 includes making the filling glue 900 contained in the interlayer channel 320 as shown in FIG. 5. At this time, as the flow charts of different embodiments shown in FIGS. 13A-13B, the display device manufacturing method further includes step 1081 of disposing a first isolating glue strip at least partially along one side of the interlayer channel, wherein the isolating glue strip connects the portion of the end edge of the protecting layer extending out of the side edge of the display layer with the carrying surface to isolate the filling glue within the interlayer channel from the filling glue outside the interlayer channel. The viscosity of the first isolating glue strip before hardening is greater than the viscosity of the filling glue before hardening. More particularly, the first isolating glue strip 910 is preferably sticky semi-solid/semi-liquid material before hardening. The first isolating glue strip 910 can be disposed at least partially along one side of the interlayer channel 320 by approaches such as smearing, and connects the portion of the end edge 510 of the protecting layer 500 that extends out of the side edge 310 of the display layer 300 with the carrying surface 110 to isolate the filling glue 900 within the interlayer channel 320 from the filling glue 900 outside the interlayer channel 320 as shown in FIG. 6B. Step 1090 includes determining the filling amount of the filling glue to control the amount of the filling glue filled into the interlayer channel.

In another embodiment, step 1050 includes making the end edge 510 of the protecting layer 500 retreat from the side edge 310 of the display layer 300 as shown in FIGS. 11A-11C. Step 1090 includes making the filling glue 900 cover the top surface of the display layer 300. Step 1090 includes filling a glue body which is taken as the filling glue 900 in the space 400 and respectively connecting with the side edge 310 of the display layer 300, the electronic unit 700, and the carrying surface 110 as shown in FIG. 11A, wherein the glue body is capable of absorbing energy to transform from liquid state to solid state. Step 1090 includes taking a film capable of being bent as the filling glue 900 and inserting the film into to fill the space 400 as shown in FIG. 11B. On the other hand, step 1090 can includes: filling a glue body 901 in the space 400 and respectively connecting with the side edge 310 of the display layer 300, the electronic unit 700, and the carrying surface 110 as shown in FIG. 11C; applying energy onto the glue body 901 to transform the glue body 901 from liquid state to solid state; and covering and adhering a film 902 to a portion of the protecting layer 500 and the glue body 901 as shown in FIG. 11C.

Figure 13A:
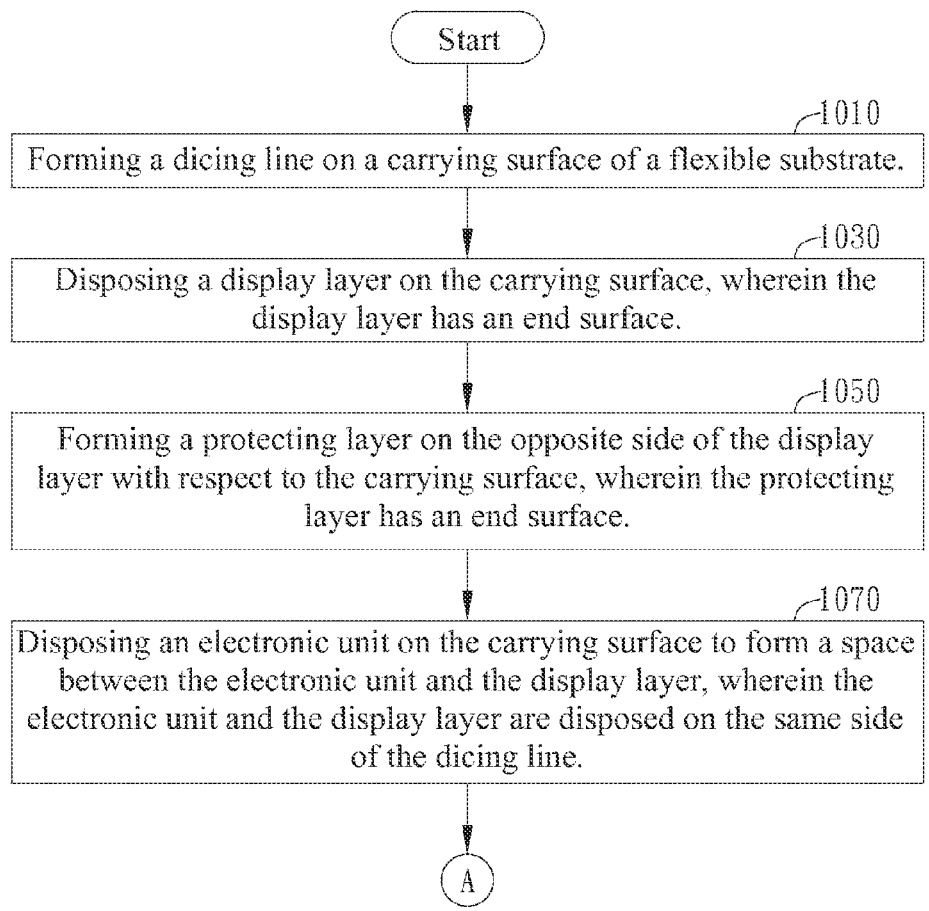
FIGS. 13A and 13B are flow charts of different embodiments of the display device manufacturing method of the present invention.
Figure 13B:
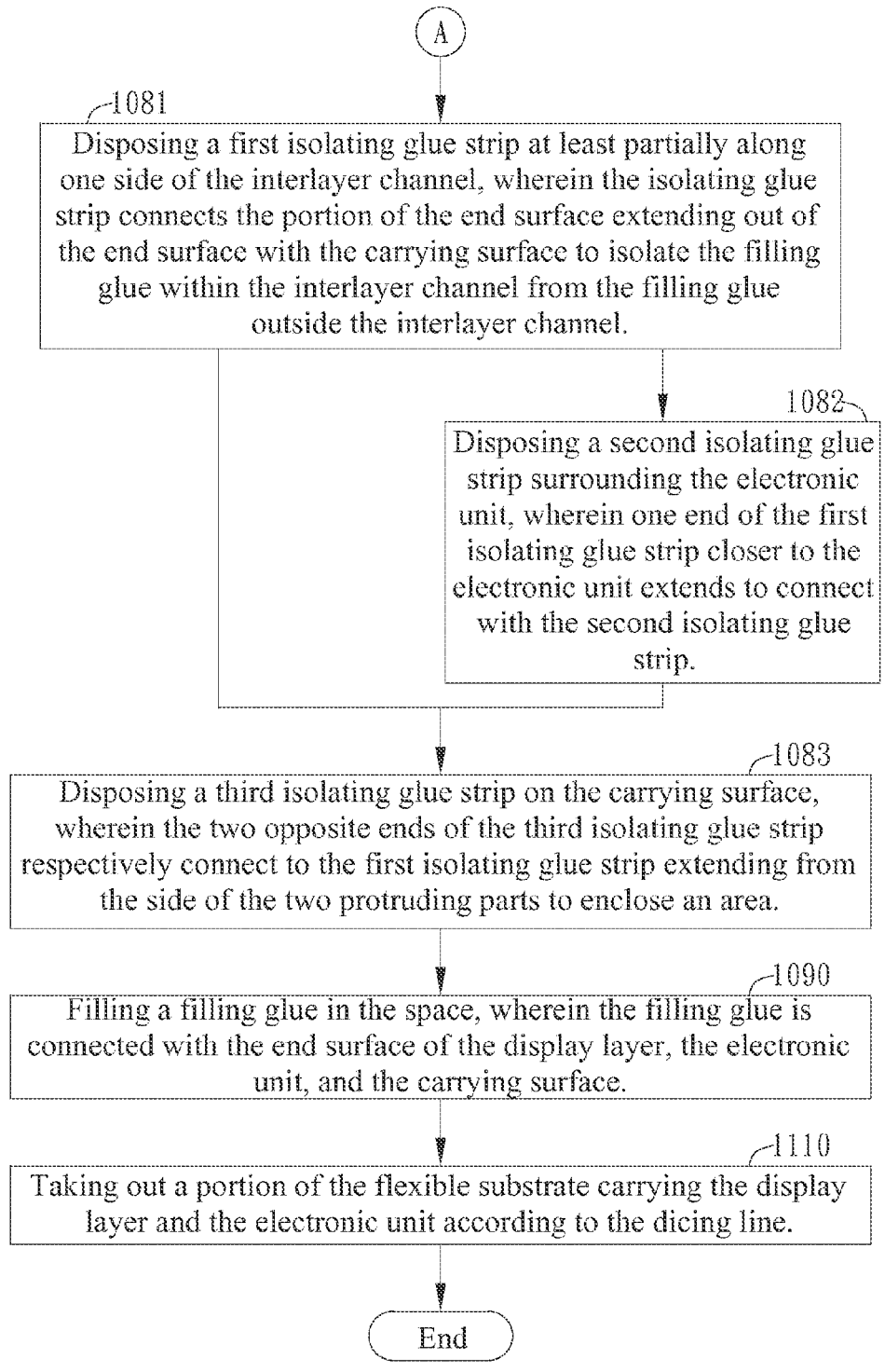

As different embodiments shown in FIGS. 13A-13B, the display device manufacturing method of the present invention further includes step 1082 of disposing a second isolating glue strip surrounding the electronic unit, wherein one end of the first isolating glue strip closer to the electronic unit extends to connect with the second isolating glue strip, wherein the viscosity of the second isolating glue strip before hardening is greater than the viscosity of the filling glue before hardening. More particularly, the second isolating glue strip 920 is preferably sticky semi-solid/semi-liquid material before hardening. The second isolating glue strip 920 can surround the electronic unit 700 and connect with the extended end of the first isolating glue strip 910 close to the electronic unit 700 as shown in FIG. 7.

As the embodiment shown in FIG. 7, the side edge 310 includes two protruding parts 311 disposed apart and symmetrically, wherein the electronic unit 700 is disposed between the protruding parts 311, and wherein the interlayer channel 320 and the first isolating glue strip 910 are disposed along the sides of the protruding parts 311 facing the electronic unit 700. As the different embodiments shown in FIGS. 13A-13B, the display device manufacturing method of the present invention further includes step 1083 of disposing a third isolating glue strip on the carrying surface, wherein the two opposite ends of the third isolating glue strip respectively connect to the first isolating glue strip extending from the side of the two protruding parts to enclose an area. The viscosity of the third isolating glue strip before hardening is greater than the viscosity of the filling glue before hardening. More particularly, the third isolating glue strip 930 is preferably sticky semi-solid/semi-liquid material before hardening. The third isolating glue strip 930 can surround the electronic unit 700 by approaches such as smearing, be disposed on the carrying surface 110, making the two opposite ends of the third isolating glue strip 930 respectively connect to the first isolating glue strip 910 extending from the side of the two protruding parts 311 to enclose an area.

As the different embodiments shown in FIGS. 13A-13B, step 1050 includes: making one end of the interlayer channel extend toward the cutting line; and cutting the protecting layer and the display layer so that the protecting layer is flush with the display layer at or close to the intersection of the interlayer channel and the cutting line to interrupt the interlayer channel. More particularly, as the embodiment shown in FIG. 8A, the side edge 310 of the display layer 300 includes two protruding parts 311 disposed apart and symmetrically, wherein the electronic unit 700 is disposed between the protruding parts 311. The interlayer channel 320 is disposed along the sides of the protruding parts 311 facing the electronic unit 700 and is interrupted at the bottom end of the protruding parts 311. The method further includes step 1083 of disposing a third isolating glue strip 930 on the carrying surface 110 as shown in FIG. 8A, wherein the two opposite ends of the third isolating glue strip 930 respectively connect to where the interlayer channel 320 extending along the sides of the two protruding parts 311 stops to enclose an area. The viscosity of the third isolating glue strip 930 before hardening is greater than the viscosity of the filling glue 900 before hardening.

In different embodiments, step 1050 includes: making one end of the interlayer channel 320 extend toward the cutting line 120; and forming an opening 520 on the protecting layer 500 at or close to the intersection of the interlayer channel 320 and the cutting line 120 to interrupt the interlayer channel 320. FIG. 9A is a schematic view of an embodiment of forming an opening 520 on the protecting layer 500 close to the intersection of the interlayer channel 320 and the cutting line 120 and is above the interlayer channel 320.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A display device, comprising:
    a flexible substrate having a carrying surface;
    a display layer disposed on the carrying surface, wherein the display layer has a side edge;
    a protecting layer disposed on the opposite side of the display layer with respect to the carrying surface, wherein the protecting layer has an end edge protruding over the side edge of the display layer, the portion of the end edge of the protecting layer protruding over the side edge of the display layer forms an interlayer channel with the carrying surface along the extending direction of the side edge of the display layer;
    an electronic unit disposed on the carrying surface, wherein a space is formed between the electronic unit and the side edge of the display layer;
    a filling glue filled in the space and connected with the side edge of the display layer, the electronic unit, and the carrying surface, wherein a portion of the filling glue is contained in the interlayer channel; and
    a first isolating glue strip at least partially disposed along one side of the interlayer channel, wherein the isolating glue strip connects the portion of the end edge of the protecting layer extending out of the side edge of the display layer with the carrying surface to isolate the filling glue within the interlayer channel from the filling glue outside the interlayer channel.

2. The display device of claim 1, wherein the Young's modulus of the filling glue and the Young's modulus of the display layer are substantially the same or less than 15% in difference between the two.

3. The display device of claim 1, wherein the Young's modulus of the filling glue is between the Young's modulus of the display layer and the Young's modulus of the flexible substrate.

4. The display device of claim 1, wherein the filling glue covers a portion of a top surface of the electronic unit.

5. The display device of claim 1, wherein the filling glue surrounds the electronic unit.

6. The display device of claim 1, wherein the flexible substrate has a circuit formed on the carrying surface, wherein the electronic unit is coupled to the circuit and the circuit within the space is covered by the filling glue.

7. The display device of claim 6, further comprising a circuit board coupled to the circuit, wherein the electronic unit is disposed between the circuit board and the side edge of the display layer, and the filling glue is filled between the electronic unit and the circuit board.

8. The display device of claim 7, wherein the filling glue covers a portion of a top surface of the circuit board.

9. The display device of claim 1, wherein the ratio of the length of the portion of the end edge of the protecting layer protruding over the side edge of the display layer to the thickness of the display layer is between 9.31 and 12.42.

10. The display device of claim 1, further comprising a second isolating glue strip surrounding the electronic unit, wherein one end of the first isolating glue strip closer to the electronic unit extends to connect with the second isolating glue strip.

11. The display device of claim 1, wherein the display layer includes two protruding parts disposed apart and facing to each other, wherein the electronic unit is disposed between the protruding parts, wherein the interlayer channel and the first isolating glue strip are disposed along the sides of the protruding parts facing the electronic unit.

12. The display device of claim 11, further comprising a third isolating glue strip disposed on the carrying surface, wherein the two opposite ends of the third isolating glue strip respectively connect to the first isolating glue strip extending from the side of the two protruding parts to enclose an area.

13. The display device of claim 1, wherein the display layer includes two protruding parts disposed apart and facing to each other, wherein the electronic unit is disposed between the protruding parts, wherein the interlayer channel is disposed along the sides of the protruding parts facing the electronic unit and is interrupted at the end of the protruding parts.

14. The display device of claim 13, further comprising a third isolating glue strip disposed on the carrying surface, wherein the two opposite ends of the third isolating glue strip respectively connect to where the interlayer channel extending along the sides of the two protruding parts stops to enclose an area.

15. The display device of claim 1, wherein the filling glue includes:
    a glue body filled in the space and connected with the side edge of the display layer, the electronic unit, and the carrying surface, wherein the glue body is capable of absorbing energy to transform from liquid state to solid state; and a film covering and adhering to a portion of the protecting layer and the glue body.

16. A display device manufacturing method, comprising:
forming a cutting line on a carrying surface of a flexible substrate;
disposing a display layer on the carrying surface, wherein the display layer has a side edge;
forming a protecting layer on the opposite side of the display layer with respect to the carrying surface, wherein the protecting layer has an end edge extending out of the side edge of the display layer, wherein the portion of the end edge of the protecting layer extending out of the side edge of the display layer forms an interlayer channel with the carrying surface along the extending direction of the side edge of the display layer;
disposing an electronic unit on the carrying surface to form a space between the electronic unit and the display layer, wherein the electronic unit and the display layer are disposed on the same side of the cutting line;
filling a filling glue in the space, wherein the filling glue is connected with the side edge of the display layer, the electronic unit, and the carrying surface, wherein the filling glue is contained in the interlayer channel;
disposing a first isolating glue strip at least partially along one side of the interlayer channel, wherein the isolating glue strip connects the portion of the end edge of the protecting layer extending out of the side edge of the display layer with the carrying surface to isolate the filling glue within the interlayer channel from the filling glue outside the interlayer channel, the viscosity of the first isolating glue strip before hardening is greater than the viscosity of the filling glue before hardening; and
taking out a portion of the flexible substrate carrying the display layer and the electronic unit according to the cutting line.

17. The method of claim 16, wherein the step of filling the filling glue includes making the filling glue partially overflow the space and covers the electronic unit.

18. The method of claim 16, wherein the step of filling the filling glue includes making the filling glue surround the electronic unit.

19. The method of claim 16, wherein the step of filling the filling glue includes determining the filling amount of the filling glue to control the amount of the filling glue filled into the interlayer channel.

20. The method of claim 16, further comprising disposing a second isolating glue strip surrounding the electronic unit, wherein one end of the first isolating glue strip closer to the electronic unit extends to connect with the second isolating glue strip, the viscosity of the second isolating glue strip before hardening is greater than the viscosity of the filling glue before hardening.

21. The method of claim 16, wherein the display layer includes two protruding parts disposed apart and facing to each other, the electronic unit is disposed between the protruding parts, the interlayer channel and the first isolating glue strip are disposed along the sides of the protruding parts facing the electronic unit, the method further comprising disposing a third isolating glue strip on the carrying surface, wherein the two opposite ends of the third isolating glue strip respectively connect to the first isolating glue strip extending from the side of the two protruding parts to enclose an area, the viscosity of the third isolating glue strip before hardening is greater than the viscosity of the filling glue before hardening.

22. The method of claim 16, wherein the step of forming the protecting layer includes:
making one end of the interlayer channel extend toward the cutting line; and
cutting the protecting layer and the display layer so that the protecting layer is flush with the display layer at or close to the intersection of the interlayer channel and the cutting line to interrupt the interlayer channel.

23. The method of claim 22, wherein the display layer includes two protruding parts disposed apart and facing to each other, the electronic unit is disposed between the protruding parts, the interlayer channel is disposed along the sides of the protruding parts facing the electronic unit and is interrupted at the bottom end of the protruding parts, the method further comprises disposing a third isolating glue strip on the carrying surface, wherein the two opposite ends of the third isolating glue strip respectively connect to where the interlayer channel extending along the sides of the two protruding parts stops to enclose an area, the viscosity of the third isolating glue strip before hardening is greater than the viscosity of the filling glue before hardening.

24. The method of claim 16, wherein the step of forming the protecting layer includes:
making one end of the interlayer channel extend toward the cutting line; and
forming an opening on the protecting layer at or close to the intersection of the interlayer channel and the cutting line to interrupt the interlayer channel.

* * * * *